(12) United States Patent
Zhang

(10) Patent No.: US 11,895,792 B2
(45) Date of Patent: Feb. 6, 2024

(54) DISPLAY DEVICE

(71) Applicant: Shanghai Tianma Microelectronics Co., Ltd., Shanghai (CN)

(72) Inventor: Kaikai Zhang, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 188 days.

(21) Appl. No.: 17/547,798

(22) Filed: Dec. 10, 2021

(65) Prior Publication Data

US 2022/0104371 A1 Mar. 31, 2022

(30) Foreign Application Priority Data

Jul. 23, 2021 (CN) .......................... 202110837724.1

(51) Int. Cl.
*H05K 5/00* (2006.01)
*H05K 5/02* (2006.01)
*H01F 7/02* (2006.01)

(52) U.S. Cl.
CPC ............. *H05K 5/0217* (2013.01); *H01F 7/02* (2013.01); *H05K 5/0017* (2013.01)

(58) Field of Classification Search
USPC ........................................ 361/807, 809, 810
See application file for complete search history.

(56) References Cited

U.S. PATENT DOCUMENTS

| | | | | |
|---|---|---|---|---|
| 2019/0086966 A1* | 3/2019 | Lin | ........................ | G06F 1/1616 |
| 2019/0150301 A1* | 5/2019 | Chuang | ................ | H05K 5/0226 |
| | | | | 361/749 |
| 2020/0352046 A1* | 11/2020 | Kim | ..................... | H04M 1/0268 |

FOREIGN PATENT DOCUMENTS

| | | | | | |
|---|---|---|---|---|---|
| CN | 207184560 | | * | 4/2018 | ............... G06F 1/16 |
| CN | 108660702 | A | | 10/2018 | |
| CN | 110176188 | A | | 8/2019 | |
| CN | 110730255 | A | | 1/2020 | |
| CN | 111131568 | A | | 5/2020 | |
| CN | 111724684 | | * | 9/2020 | ............... G09F 9/30 |

* cited by examiner

*Primary Examiner* — Hung S. Bui
(74) *Attorney, Agent, or Firm* — KDW Firm PLLC

(57) ABSTRACT

Provided display device includes at least one magnetic component, first display segment and second display segment connected to each other and foldable towards each other. The magnetic component includes first magnetic module located in non-display region of first display segment and second magnetic module located in non-display region of second display segment. The display device includes first folded state in which contact ends come into contact and second folded state in which the contact ends in contact for period of time. The attractive force A of the first magnetic module to the second magnetic module in the first folded state is smaller than the attractive force B thereof in the second folded state. The preceding solution can prevent the user's hands from being gripped when the user folds the display device and can ensure that the display device maintains stable folded state.

19 Claims, 12 Drawing Sheets

DISPLAY DEVICE

CROSS-REFERENCE TO RELATED APPLICATION(S)

This application claims priority to Chinese Patent Application No. 202110837724.1 filed Jul. 23, 2021, the disclosure of which is incorporated herein by reference in its entirety.

TECHNICAL FIELD

Embodiments of the present disclosure relate to the field of display technologies and, in particular, to a display device.

BACKGROUND

With the updating of display devices, the display screens of various types of the display devices, such as mobile phones and tablet computers, are becoming larger and larger. With the enlargement of the display screens, problems such as inconvenience in portability and storage arise. Therefore, foldable screen emerges as the times require.

Most of the existing display devices are configured with a pair of magnetic elements to achieve the purpose of maintaining a folded state of the display device through a mutual an attractive force between the pair of magnetic elements after the display device is folded. However, when the display device is being folded, the attractive force between the pair of magnetic elements increases rapidly due to as a distance there between is shorten. In a state when the display device has just reached the folded state, the attractive force between the pair of magnetic elements increases sharply to maximum, which may cause the user's hands to be gripped easily, affecting the user experience.

SUMMARY

The embodiments of the present disclosure provide a display device to prevent the user's hands from being gripped when the user folds the display device and ensure that the display device can maintain a stable folded state.

A display device includes a first display segment and a second display segment connected to each other and foldable towards each other. The display device further includes at least one magnetic component.

The magnetic component includes a first magnetic module and a second magnetic module. The first magnetic module is located in the non-display region of the first display segment. The second magnetic module is located in the non-display region of the second display segment.

The display device includes a first folded state and a second folded state. Two opposite ends each of which respectively belongs to the first display segment and the second display segment and faces away from a folding axis are contact ends. The first folded state is a state in which the contact ends come into contact with each other. The second folded state is a state in which the contact ends have been in contact for a period of time.

In the first folded state, the attractive force of the first magnetic module to the second magnetic module is A. In the second folded state, the attractive force of the first magnetic module to the second magnetic module is B, and A<B.

DETAILED DESCRIPTION

Figure 1:
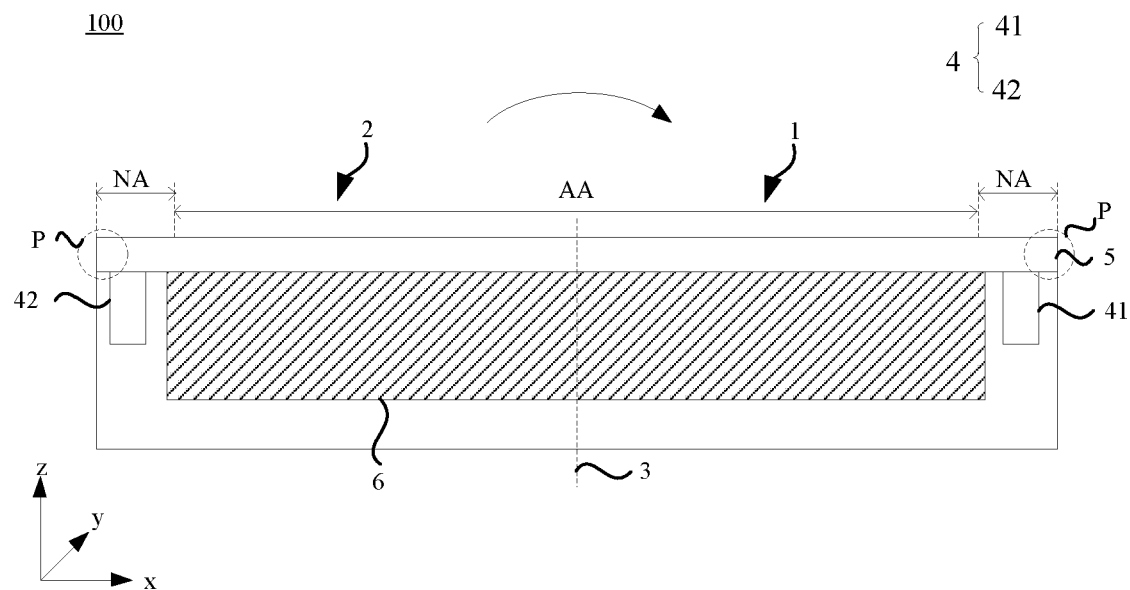
FIG. 1 is a structural diagram of a display device in an unfolded state according to an embodiment of the present disclosure.

The present disclosure is further described hereinafter in detail in conjunction with drawings and embodiments. It is to be understood that the embodiments described herein are merely intended to explain the present disclosure rather than to limit the present disclosure. Additionally, it is to be noted that for ease of description, only a part, not all, of the structures related to the present disclosure are illustrated in the drawings. Moreover, the shape and size of each element in the drawings do not reflect the actual scale, and the purpose is merely to schematically illustrate the content of the present disclosure.

Figure 2:
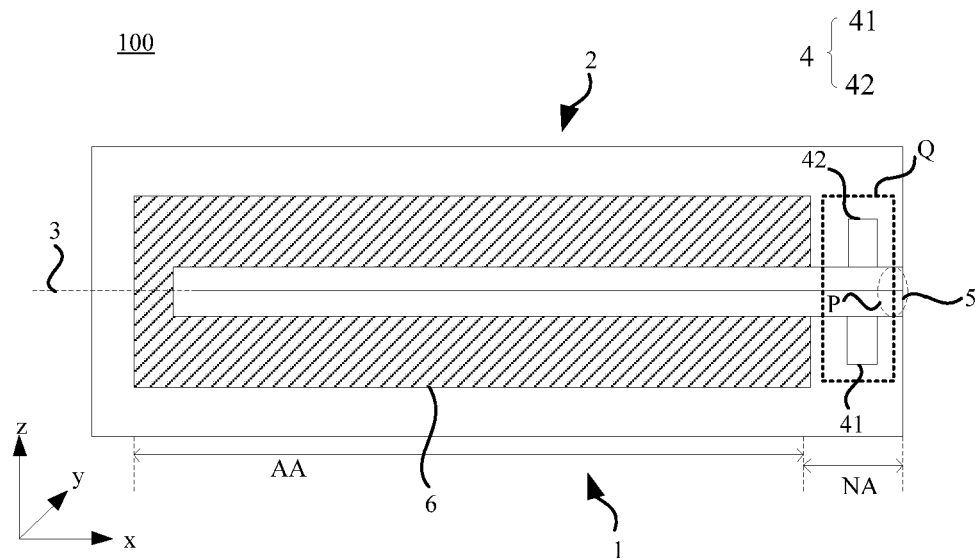
FIG. 2 is a structural diagram of a display device in a first folded state according to an embodiment of the present disclosure.

FIG. 1 is a structural diagram of a display device in an unfolded state according to an embodiment of the present disclosure. FIG. 2 is a structural diagram of a display device in a first folded state according to an embodiment of the present disclosure. Referring to FIGS. 1 and 2, a display device 100 according to this embodiment of the present disclosure includes the first display segment 1 and the second display segment 2 connected to each other and foldable towards each other. The display device 100 further includes at least one magnetic component 4. The magnetic component 4 includes a first magnetic module 41 and a second magnetic module 42. The first magnetic module 41 is located in the non-display region NA of the first display segment 1. The second magnetic module 42 is located in the non-display region NA of the second display segment 2. The display device 100 includes a first folded state and a second folded state. The two opposite ends each of which respectively belongs to the first display segment 1 and the second display segment 2 and faces away from a folding axis 3 are contact ends P. The first folded state is a state in which the contact ends P come into contact with each other. The second folded state is a state in which the contact ends P have been in contact for a period of time. In the first folded state, the attractive force of the first magnetic module 41 to the second magnetic module 42 is A. In the second folded state, the attractive force of the first magnetic module 41 to the second magnetic module 42 is B, and A<B.

In the embodiment of the present disclosure, the display device 100 includes the first display segment 1 and the second display segment 2. Referring to FIG. 1, in the display device 100, a portion on the right side of the folding axis 3 is the first display segment 1, and a portion on the left side of the folding axis 3 is the second display segment 2. The first display segment 1 and the second display segment 2 each includes a display region AA and a non-display region NA located on at least one side of the display region AA. At a position where the folding axis 3 is located, the display region of the first display segment 1 and the display region of the second display segment 2 may be connected to each other (as shown in FIG. 1) or may be disconnected from each other, which may be carried out according to actual product requirements. The first magnetic module 41 and the second magnetic module 42 may be disposed at positions respectively in the non-display regions NA of the first display segment 1 and the second display segment 2 and opposite to each other after the display device is folded. Consequently, the display device 100 may maintain a folded state by an attractive force between the first magnetic module 41 and the second magnetic module 42 after the display device is folded.

After the display device 100 is folded in a direction along an arrow shown in FIG. 1, the display device 100 presents in a folded state shown in FIG. 2. Referring to FIGS. 1 and 2, studies found that in a state when the contact ends P of the display device come into contact with each other, if an attractive force between the magnetic elements increases sharply to a maximum value due to that a distance therebetween is shorten, the user's hands are easily gripped.

In the embodiment of the present disclosure, the first folded state is a state in which the contact ends P come into contact with each other. In other words, the first folded state refers to the state when the display device is just closed. The second folded state refers to a state in which the contact ends P have been in contact for a period of time, that is, a folded state after a certain period of time from the time when the display device is just closed. For example, a certain period of time here may be a few seconds. In the embodiment of the present disclosure, the attractive force A of the first magnetic module 41 to the second magnetic module 42 in the first folded state is smaller than the attractive force B of the first magnetic module 41 to the second magnetic module 42 in the second folded state. Therefore, in a state when the contact ends P of the display device come into contact with each other, the attractive force between the first magnetic module 41 and the second magnetic module 42 is smaller. In this manner, the user's hands can be prevented from being gripped due to that the attractive force increases sharply to the maximum value in a state when the contact ends P of the display device come into contact with each other. Further, the attractive force between the first magnetic module 41 and the second magnetic module 42 may be increased until the maximum value (for example, B) is reached in a state when the contact ends P of the display device are in contact for a certain period of time, thereby ensuring that the display device can maintain a stable folded state. A description is given below by using an example in which the attractive force between the first magnetic module 41 and the second magnetic module 42 reaches the maximum value in the second folded state.

In an embodiment, the magnetic elements may be disposed in the first magnetic module 41 and the second magnetic module 42 respectively. The attractive force of the first magnetic module 41 to the second magnetic module 42 and the attractive force of the second magnetic module 42 to the first magnetic module 41 are mutual. The attractive force between the first magnetic module 41 and the second magnetic module 42 is related to an opposing area between the magnetic elements and a distance between the magnetic elements. The opposing area refers to an opposing area of the magnetic elements in a plane parallel to a plane where the first display segment 1 is located (for example, the x-y plane in FIG. 2). The distance refers to a distance between the magnetic elements in a direction perpendicular to the plane where the first display segment 1 is located (for example, the z-direction in FIG. 2). When the opposing area of the two magnetic elements is maximum, and the distance between the two magnetic elements is minimum, the attractive force between the two magnetic elements reaches maximum.

Therefore, the distance between the magnetic element of the first magnetic module 41 and the magnetic element of the second magnetic module 42 in the first folded state may be disposed as a first distance. The distance between the magnetic element of the first magnetic module 41 and the magnetic element of the second magnetic module 42 in the second folded state may be disposed as a second distance. The first distance may be larger than the second distance to implement A<B. The first distance and the second distance may be a distance between the magnetic elements in any direction in a three-dimensional direction. For example, in the first folded state, the magnetic elements may have a certain distance in the direction perpendicular to the plane where the first display segment 1 is located, and/or the magnetic elements may have a certain distance in a direction parallel to the plane where the first display segment 1 is located. It may be understood that the opposing area of the two magnetic elements is relatively small or even become zero when the magnetic element of the first magnetic module 41 and the magnetic element of the second magnetic module 42 have a certain distance in a direction parallel to a display surface. In the second folded state, the distance between the magnetic elements in the direction perpendicular to the plane where the first display segment is located is zero (ignoring a space due to a structure such as a cover plate 5), and the opposing area in the plane parallel to the plane where the first display segment is located is maximum. As a result, the attractive force between the first magnetic module 41 and the second magnetic module 42 reaches the maximum value.

In addition to the preceding implementations, in other embodiments, a magnetic field intensity of at least one of the first magnetic module 41 and the second magnetic module 42 may be configured to be changeable to implement A<B. In this case, a detection device may be configured to detect a state of the contact ends P. After the contact ends P is detected as being in a contact, the attractive force between the first magnetic module 41 and the second magnetic module 42 may increase to the maximum value in a state when the contact ends P of the display device are in contact for a certain period of time with the arrangement in which the magnetic field strength of the first magnetic module 41 is controlled to increase, and/or the magnetic field strength of the second magnetic module 42 is controlled to increase. For example, the first magnetic module 41 may include an electromagnet, and/or the second magnetic module 42 may include an electromagnet. The electromagnet includes an iron core and coils surrounding the iron core. After the first folded state is reached, a magnetic field strength of the electromagnet may be increased with the arrangement in which the current on the coils is increased. In this manner, the attractive force between the first magnetic module 41 and the second magnetic module 42 is increased from A to B.

Referring to FIG. 1, in an embodiment, the display device 100 further includes a cover plate 5 located on a display side of the first display segment 1 and a display side of the second display segment 2. The first magnetic module 41 and the second magnetic module 42 are located on a non-display side of the cover plate 5. The cover plate 5 is a transparent cover plate and plays a role of encapsulation and protection.

With continued reference to FIG. 1, in an embodiment, the display device 100 also includes a flexible display panel 6. In the unfolded state, the first magnetic module 41 and the second magnetic module 42 are respectively located on two opposite sides of the flexible display panel 6 facing away from the folding axis 3. The two opposite sides each of which respectively belongs to the flexible display panel 6 and faces away from the folding axis 3 are close to the contact ends P of the display device. Since the contact ends P face away from the folding axis 3, the contact ends P in the display device are most easily unfolded by an external force. According to a relationship between a force and a force arm (a lever principle), the attractive force between the first magnetic module 41 and the second magnetic module 42 in the second folded state may provide a resisting force to the display device from being unfolded. With the arrangement in which the first magnetic module 41 and the second magnetic module 42 are disposed in positions close to the contact ends P of the display device, the action point of the resisting force may face away from the folding axis 3, that is, a resisting force arm is larger. Therefore, a larger external force (for example, force exerted by a human being) is required to act on the contact ends P to unfold the display device. The external force (for example, a collision) caused by other non-human factors is difficult to unfold the display device in the folded state. In this manner, the stability of the folded state can be improved.

It is to be noted that the preceding structures are not to limit the present disclosure. In other embodiments, in the unfolded state, the first magnetic module 41 and the second magnetic module 42 may be respectively disposed on the two opposite sides of the flexible display panel 6 in the extension direction of the folding axis 3. In addition, a number of the magnetic component 4 is not limited in the embodiments of the present disclosure. A plurality of the magnetic modules 4 may be disposed in the non-display region around the flexible display panel 6. Therefore, a plurality of pairs of the first magnetic module 41 and the second magnetic module 42 are located on any two opposite sides of the flexible display panel 6 respectively. For example, a plurality of pairs of the first magnetic module 41 and the second magnetic module 42 are disposed in the x-direction and/or in the y-direction in FIG. 1 to improve the stability of the folded state.

In the embodiments of the present disclosure, the first magnetic module is disposed in the non-display region of the first display segment, and the second magnetic module is disposed in the non-display region of the second display segment. Moreover, in a state when the contact ends of the display device come into contact with each other, that is, in the first folded state, the attractive force between the first magnetic module and the second magnetic module is smaller. In this manner, the user's hands may be prevented from being gripped in a state when the display device has just reached the folded state when the user folds the display device. Further, in a state when the contact ends of the display device contact for a certain period of time, that is, in the second folded state, the attractive force between the first magnetic module and the second magnetic module is larger, thereby ensuring that the display device can maintain a stable folded state.

On the basis of the preceding embodiments, in an embodiment, the display device 100 may perform a magnetic attraction movement from the first folded state to the second folded state. During the magnetic attraction movement, the attractive force of the first magnetic module 41 to the second magnetic module 42 increases progressively.

In an embodiment, compared to the second folded state, there may be a larger distance between the magnetic element of the first magnetic module 41 and the magnetic element of the second magnetic module 42 in the first folded state. Consequently, the magnetic elements respectively of the first magnetic module 41 and the second magnetic module 42 still have a space to get close to each other. After the first folded state is reached, the magnetic element of the first magnetic module 41 and the magnetic element of the second magnetic module 42 may perform the magnetic attraction movement under the action of the attractive force to shorten the distance between the first magnetic module 41 and the second magnetic module 42. At the same time, since the distance between the magnetic elements thereof is shortened, the attractive force of the first magnetic module 41 to the second magnetic module 42 increases progressively until the attractive force reaches the maximum value.

Further, at least one of the first magnetic module 41 and the second magnetic module 42 may be disposed to be movable towards the other one thereof to make the attractive force of the first magnetic module 41 to the second magnetic module 42 increases progressively during the magnetic attraction movement. In an embodiment, at least a portion of the first magnetic module 41 (for example, the magnetic element of the first magnetic module 41) may move towards the second magnetic module 42 during the magnetic attraction movement. In another embodiment, at least a portion of the second magnetic module 42 may move towards the first magnetic module 41 during the magnetic attraction movement. In yet another embodiment, during the magnetic attraction movement, at least a portion of the first magnetic module 41 may move towards the second magnetic module 42, and at the same time, at least a portion of the second magnetic module 42 may move towards the first magnetic module 41.

The structure of the first magnetic module 41 and the structure of the second magnetic module 42 are described below in detail by using an example in which at least a portion of the first magnetic module 41 may move towards the second magnetic module 42 during the magnetic attraction movement.

Figure 3:
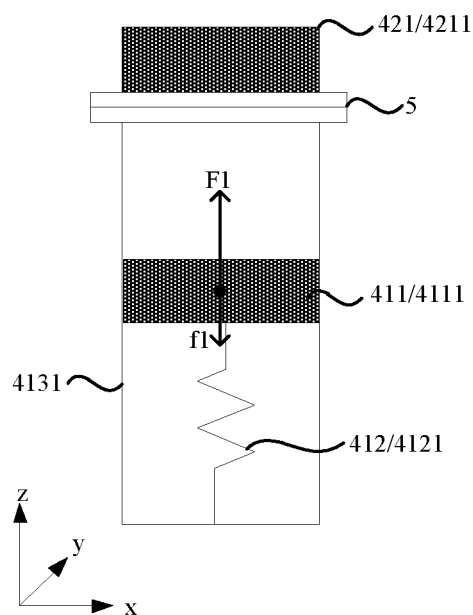
FIG. 3 is a first enlarged structural diagram of the Q region shown in FIG. 2.

FIG. 3 is a first enlarged structural diagram of the Q region shown in FIG. 2. Referring to FIG. 3, in an embodiment, the first magnetic module 41 includes a first magnetic body 411 and a first resisting force generation unit 412. The second magnetic module 42 includes at least a second magnetic body 421. During the magnetic attraction movement, the second magnetic body 421 provides a first attractive force F1 to the first magnetic body 411, the first magnetic body 411 provides a second attractive force to the second magnetic body 421, and the first resisting force generation unit 412 is configured to provide the first magnetic body 411 with a first resisting force f1 opposite to the direction of the first attractive force. The first attractive force F1 is larger than the first resisting force f1.

Referring to FIGS. 2 and 3, in an embodiment, during the magnetic attraction movement, the second magnetic body 421 is secured to a non-display side of the cover plate 5 in a case where only at least a portion of the first magnetic module 41 may move towards the second magnetic module 42. In addition, in an embodiment, the second magnetic body 421 includes a third magnet 4211.

Figure 4:
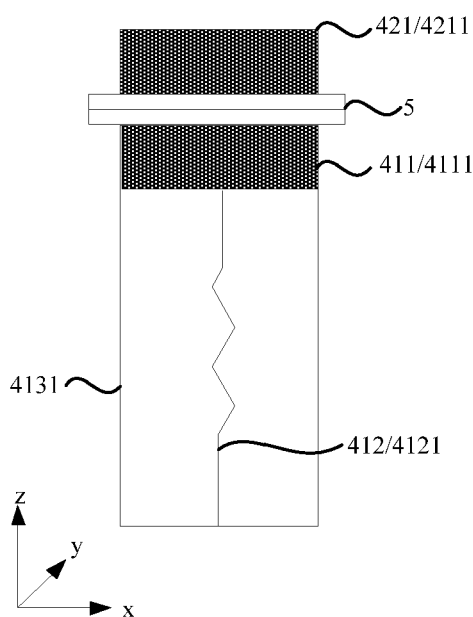
FIG. 4 is the structure shown in FIG. 3 in the second folded state.

FIG. 3 indicates a state of the first magnetic body 411 in the first folded state. It may be seen from FIG. 3 that in the first folded state, there is a certain distance between the first magnetic body 411 and the second magnetic body 421. Therefore, the attractive force between the first magnetic module 41 and the second magnetic module 42 may be smaller (not reaching the maximum value). Moreover, the user's hands can be prevented from being gripped when the user folds the display device. During the magnetic attraction movement from the first folded state to the second folded state, since the first attractive force F1 provided by the second magnetic body 421 is larger than the first resisting force f1 provided by the first resisting force generation unit 412, the first magnetic body 411 moves in a direction towards the second magnetic body 421 (for example, the z-direction in FIG. 3), and the distance between the first magnetic body 411 and the second magnetic body 421 is gradually decreased, and as a result, the attractive force between the first magnetic module 41 and the second magnetic module 42 increases progressively until the attractive force reaches the maximum value. Referring to FIG. 4, FIG. 4 is the structure shown in FIG. 3 in the second folded state. When the second folded state is reached, the opposing area of the first magnetic body 411 and the second magnetic body 421 is the maximum, the distance between the first magnetic body 411 and the second magnetic body 421 in the z-direction is the minimum, and the attractive force between the first magnetic body 411 and the second magnetic body 421 reaches the maximum value. Thus, the display device can be provided with a stable attractive force and maintain a stable folded state.

It is to be noted that before the first folded state, the first magnetic body 411 and the second magnetic body 421 may also provide an attractive force to each other due to a shortened distance therebetween when the first display segment 1 and the second display segment 2 are close to each other and a small included angle (for example, an included angle smaller than 20°) is provided therebetween. However, this attractive force is too small (smaller than the attractive force A in the first folded state) to cause the first magnetic body 411 to move towards the second magnetic body 421. In an embodiment, even if the first magnetic body 411 moves towards the second magnetic body 421, the first magnetic body 411 may only move a small distance because the first resisting force generation unit 412 may provide a resisting force to the first magnetic body 411. Therefore, when the first folded state is reached, it is possible to ensure a certain distance between the first magnetic body 411 and the second magnetic body 421. In this manner, the attractive force between the first magnetic body 411 and the second magnetic body 421 may not increase sharply to the maximum value. Consequently, the user's hands can be prevented from being gripped.

During the subsequent magnetic attraction movement, the first attractive force increases with the distance between the first magnetic body 411 and the second magnetic body 421 decreasing, the first attractive force is larger than the first resisting force. Therefore, the first magnetic body 411 moves towards the second magnetic body 421. At the same time, the first magnetic body 411 may gradually move towards the second magnetic body 421 due to the existence of the first resisting force. The attractive force between the first magnetic body 411 and the second magnetic body 421 gradually increases to avoid bringing a large acting force on the display device due to a too fast movement of the first magnetic body 411 when the second folded state is reached.

On the above basis, two possible structures of the first magnetic module 41 are provided. As a possible solution, with continued reference to FIG. 3, the first magnetic body 411 includes a first magnet 4111. The first resisting force generation unit 412, in an embodiment, includes a first spring 4121. The first magnetic module 41 further includes a first housing 4131. The first magnet 4111 and the first spring 4121 are both located in the first housing 4131. A first end of the first spring 4121 is secured to the first housing 4131. A second end of the first spring 4121 is secured to the first magnet 4111. In the first folded state, the first spring 4121 is located on a side of the first magnet 4111 facing away from the second magnetic body 421. During the magnetic attraction movement, the first magnet 4111 moves towards the second magnetic body 421 under the action of the first attractive force, and the first spring 4121 is stretched and provides the first resisting force.

The gravity factor of the first magnet 4111 is ignored, and the first spring 4121 may be in an original state in the first folded state, or in a slightly stretched state due to the first magnet 4111 moves for a small distance towards the second magnetic body 421 before the first folded state is reached. In this case, the tension (that is, the first resisting force) of the first spring 4121 to the first magnet 4111 is very small or even zero. Further, since the distance between the second magnetic 421 and the first magnet 4111 is relatively small, in the first folded state, the first attractive force of the second magnetic body 421 to the first magnet 4111 is larger than the first resisting force. In addition, the increase rate at which the attractive force between the magnetic elements increases when the distance decreases is greater than the increase rate of the tension of the spring. Therefore, during the magnetic attraction movement from the first folded state to the second folded state, the first attractive force is always larger than the first resisting force, and the first magnet 4111 may move towards the second magnetic body 421 under the action of the first attractive force.

During the magnetic attraction movement, when the distance between the first magnet 4111 and the second magnetic body 421 becomes smaller and smaller, both the first attractive force and the first resisting force become larger and larger. Therefore, the first magnet 4111 may gradually move towards the second magnetic body 421 under the action of the first resisting force. In this manner, the attractive force between the first magnet 4111 and the second magnetic body 421 gradually increases to the maximum value to avoid bringing a large acting force on the display device due to a too fast movement of the first magnet 4111 when the second folded state is reached.

In addition, since a deformation of a spring is an elasticity deformation, with the arrangement in which the first spring 4121 is selected as the first resisting force generation unit 412, not only the first resisting force may be provided to the first magnet 4111 by the first spring 4121 during the magnetic attraction movement, but also the first magnet 4111 may be returned to the original position (for example, a position in the first folded state) by a restoring force of the first spring 4121 when the user opens the display device from the folded state to the unfolded state.

Further, the first spring 4121 may originally be a non-linear spring. The non-linear spring is uneven in thickness and is uneven in density from top to bottom, and an elastic coefficient thereof is not a fixed value. Therefore, the tension (that is, the first resisting force) of the non-linear spring to the first magnet 4111 has a non-linear relationship with a moving distance of the first magnet 4111. Consequently, it may be disposed that the closer the first magnet 4111 to the second magnetic body 421 is, the larger the first resisting force provided by the first spring 4121 to the first magnet 4111 (but smaller than the first attractive force) is. As a result, the movement of the first magnet 4111 towards the second magnetic body 421 may be further slowed down to avoid bringing a large acting force on the display device due to the too fast movement of the first magnetic body 411 when the second folded state is reached.

In an embodiment, the first spring 4121 has elasticity in a first direction. The first direction is perpendicular or parallel to the plane in which the first display segment 1 is located. During the magnetic attraction movement, the first magnet 4111 moves in the first direction until the attractive force between the first magnet 4111 and the second magnetic body 421 reaches the maximum value.

For example, the first direction may refer to the z-direction in FIG. 3. The z-direction is perpendicular or parallel to the plane in which the first display segment 1 is located. During the magnetic attraction movement, the first magnet 4111 moves in the z-direction until the attractive force between the first magnet 4111 and the second magnetic body 421 reaches the maximum value, that is, the state shown in FIG. 4 is reached. In this case, the opposing area of the first magnet 4111 and the second magnetic body 421 is the maximum, and the distance between the first magnet 4111 and the second magnetic body 421 in the z-direction is the minimum. As shown in FIG. 3, in an embodiment, a side wall of the first housing 4131 may be in contact with the first magnet 4111 to provide a moving rail and support for the first magnet 4111 when the first magnet 411 moves in the z-direction. The side wall of the first housing 4131 may be smooth or rough. With a smooth side wall, the frictional force of the side wall to the first magnet 4111 may be ignored to reduce influencing factors to be considered in design and reducing design difficulty. With a rough side wall, the resistance to the first magnet 4111 may be increased to further slowdown the movement of the first magnet 4111. Those skilled in the art may design according to practical requirements and the embodiments of the present disclosure are not limited thereto.

Figure 5:
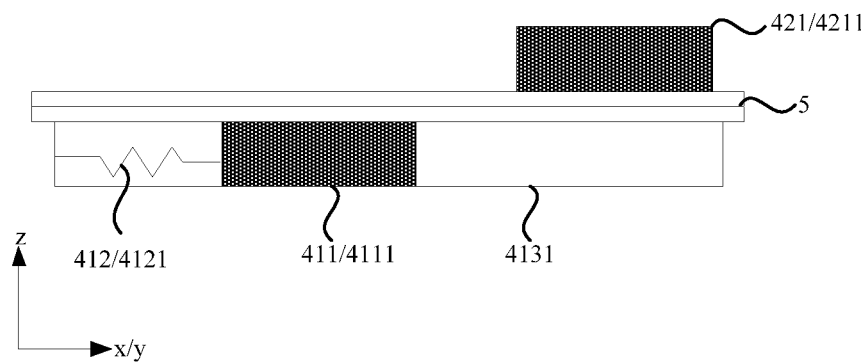
FIG. 5 is a second enlarged structural diagram of the Q region shown in FIG. 2.
Figure 6:
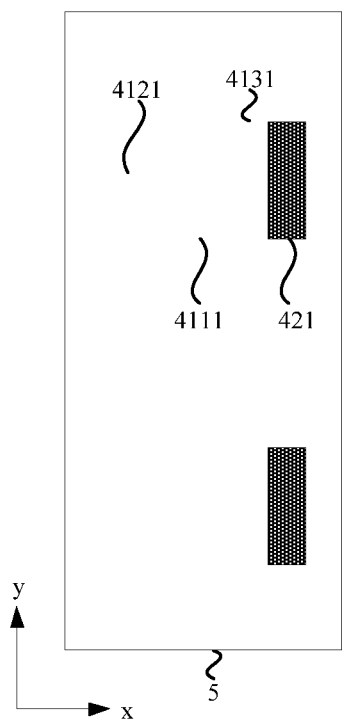
FIG. 6 is a partial top view of a display device corresponding to the structure shown in FIG. 5.
Figure 7:
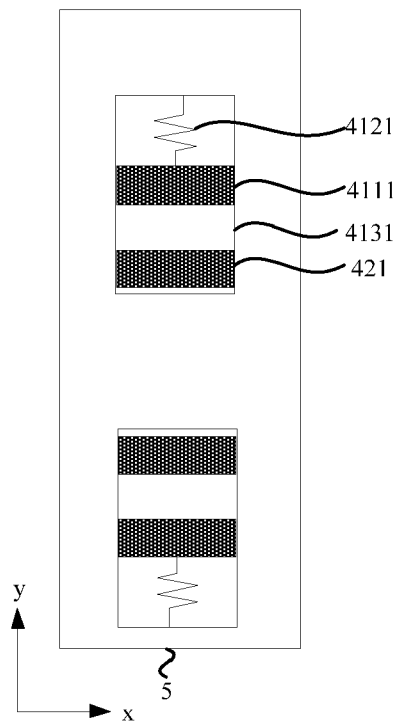
FIG. 7 is a partial top view of another display device corresponding to the structure shown in FIG. 5.

In other embodiments, the first direction may also be a direction parallel to the plane where the first display segment 1 is located, such as the x-direction or the y-direction in FIG. 3. For example, FIG. 5 is a second enlarged structural diagram of the Q region shown in FIG. 2. FIG. 6 is a partial top view of a display device corresponding to the structure shown in FIG. 5. FIG. 7 is a partial top view of another display device corresponding to the structure shown in FIG. 5. With reference to FIGS. 5 and 6, the first spring 4121 may have elasticity in the x-direction. During the magnetic attraction movement, the first magnet 4111 may move in the x-direction until the opposing area between the first magnet 4111 and the second magnetic body 421 reaches the maximum. In another embodiment, with reference to FIGS. 5 and 7, the first spring 4121 may have elasticity in the y-direction. During the magnetic attraction movement, the first magnet 4111 may move in the y-direction until the opposing area between the first magnet 4111 and the second magnetic body 421 reaches the maximum. Further, referring to FIGS. 6 and 7, there may be a plurality of pairs of the first magnetic module 41 and the second magnetic module 42. FIGS. 6 and 7 merely illustrate a case where the display device includes two pairs of the first magnetic modules 41 and the second magnetic modules 42.

Figure 8:
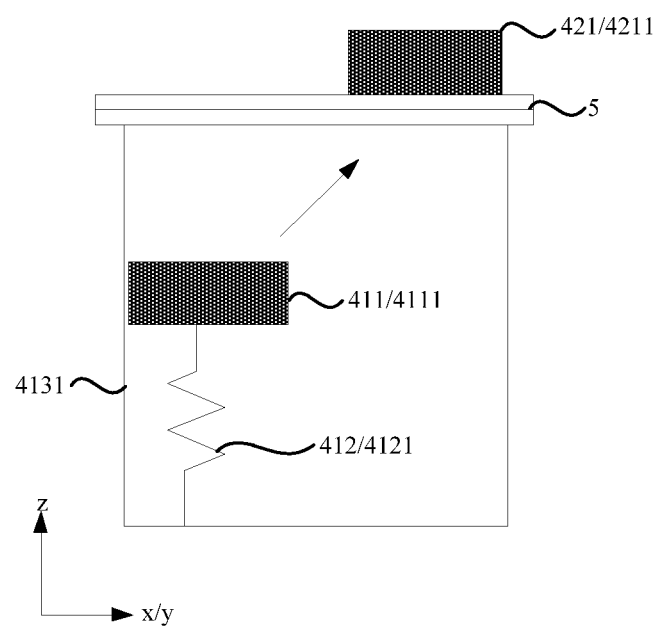
FIG. 8 is a third enlarged structural diagram of the Q region shown in FIG. 2.

In other embodiments, the first direction may also be any direction in the three-dimensional direction. In other words, the direction in which the first magnet 4111 moves towards the second magnetic body 421 may be any direction of the three-dimensional direction. FIG. 8 is a third enlarged structural diagram of the Q region shown in FIG. 2. As shown in FIG. 8, in the first folded state, the first magnet 4111 and the second magnetic body 421 not only have as zero opposing area on the x-y plane, but also have a certain distance in the z-direction. As a result, the distance between the first magnet 4111 and the second magnetic body 421 in the first folded state may be further increased, and the attractive force between the first magnet 4111 and the second magnetic body 421 in the first folded state is reduced. Moreover, the user's hands can be prevented from being gripped when the user folds the display device. During the magnetic attraction movement, the first magnet 4111 moves towards the second magnetic body 421 in the direction of the arrow shown in FIG. 8 under the action of the first attractive force, and the first spring 4121 provides the first resisting force in an opposite direction. In this case, the side wall of the first housing 4131 is not in contact with the first magnet 4111 to provide a three-dimensional motion space for the first magnetic body 411. In addition, one or more first springs 4121 may be provided, and the embodiments of the present disclosure are not limited thereto. FIG. 8 merely illustrates the structure in which the first magnetic module 41 includes one first spring 4121.

Figure 9:
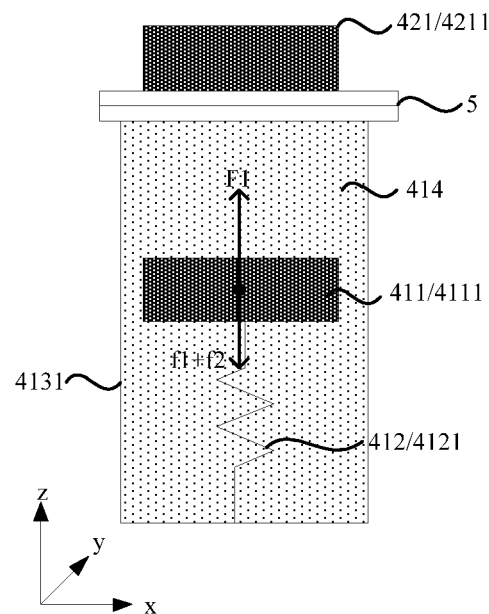
FIG. 9 is a fourth enlarged structural diagram of the Q region shown in FIG. 2.

FIG. 9 is a fourth enlarged structural diagram of the Q region shown in FIG. 2. Referring to FIG. 9, a second resisting force generation unit 414 is also disposed in the first housing. During the magnetic attraction movement, the second resisting force generation unit 414 is configured to provide the first magnet 4111 with a second resisting force f2 opposite to the direction of the first attractive force F1. The sum of the first resisting force f1 and the second resisting force f2 is smaller than the first attractive force F1.

With the arrangement in which the second resisting force generation unit 414 is configured to provide the first magnet 4111 with the second resisting force, the sum of the first resisting force f1 and the second resisting force f2 is smaller than the first attractive force F1, and the movement of the first magnet 4111 may be further slowed down to avoid bringing a large acting force on the display device due to the too fast movement of the first magnetic body 411 when the second folded state is reached.

In an embodiment, the second resisting force generation unit 414 includes a non-Newtonian fluid. The fluidity of the non-Newtonian fluid decreases as an impact force of the first magnet 4111 on the non-Newtonian fluid increases. As shown in FIG. 9, the non-Newtonian fluid is filled in the first housing 4131.

The first magnet 4111 may exert a force on the non-Newtonian fluid during movement. During the magnetic attraction movement, the impact force of the first magnet 4111 on the non-Newtonian fluid increases when the movement of the first magnet 4111 is faster due to a larger first attractive force. As a result, the fluidity of the non-Newtonian fluid decreases, and the second resisting force increases. In this manner, the movement of the first magnet 4111 may be slowed down, and the attractive force between the first magnet 4111 and the second magnetic body 421 gradually increases.

In addition, when unfolding the display device, the non-Newtonian fluid provides the first magnet 4111 with a resisting force opposite to a tension of the first spring 4121. Although at the beginning, the tension of the first spring 4121 is larger, the movement of the first magnet 4111 is faster, the fluidity of the non-Newtonian fluid is smaller, and the resisting force provided for the first magnet is larger. However, in the process of restoring the original state of the first spring, the tension of the first spring 4121 gradually decreases, the movement of the first magnet 4111 also decreases, and the fluidity of the non-Newtonian fluid increases accordingly. Therefore, it can ensure that the first magnet 4111 can return to the initial position.

In view of above, the structure of the first magnetic module 41 is described in detail in the preceding embodiments. The preceding embodiments may be combined with each other in a case of no contradiction, and the embodiments of the present disclosure are not limited thereto.

Figure 10:
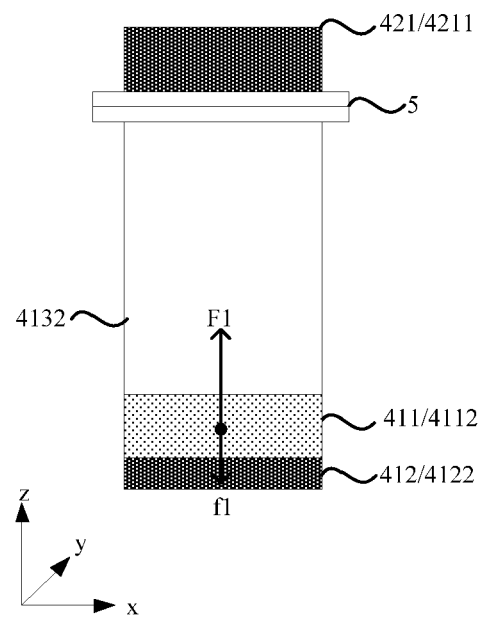
FIG. 10 is a fifth enlarged structural diagram of the Q region shown in FIG. 2.

As another possible solution for the structure of the first magnetic module 41, FIG. 10 is a fifth enlarged structural diagram of the Q region shown in FIG. 2. Referring to FIG. 10, the first magnetic body 411, in an embodiment, includes a magnetic fluid 4112. The first resisting force generation unit 412, in an embodiment, includes a second magnet 4122. The first magnetic module 41 further includes a second housing 4132. At least the magnetic fluid 4112 is located in the second housing. The second magnet 4122 is secured to the second housing 4132. In the first folded state, the second magnet 4122 is located on a side of the magnetic fluid 4112 facing away from the second magnetic body 421, the magnetic field direction generated by the second magnet 4122 and the magnetic field direction generated by the second magnetic body 421 are the same, and the magnetic field intensity of the second magnet 4122 is smaller than the magnetic field intensity of the second magnetic body 421. During the magnetic attraction movement, the magnetic fluid 4112 flows towards the second magnetic body 421 under the action of the first attractive force.

The magnetic fluid is a kind of functional material which not only has the fluidity of a liquid and the magnetism of a solid magnetic material. When an external magnetic field is applied, the magnetic fluid exhibits the magnetism. Since the magnetic fluid 4112 has the fluidity, and the state of the display device during usage is complicated and changeable. In the embodiment of the present disclosure, the second magnet 4122 is used as the first resisting force generation unit 412. Therefore, the magnetic fluid 4112 may be adsorbed by the second magnet 4122 in the unfolded state to prevent the magnetic fluid 4112 from flowing freely in the second housing 4132. Consequently, the stability of the display device is improved. In addition, referring to FIG. 1, the display device is folded randomly. It is possible that the first display segment 1 is at a lower position, and the second display segment 2 is folded towards the first display segment 1 along the folding axis 3. It is also possible that the second display segment 2 is at a lower position, and the first display segment 1 is folded towards the second display segment 2 along the folding axis 3. It is also possible to fold the first display segment 1 and the second display segment 2 towards each other along the folding axis 3 at a same time. In the embodiment of the present disclosure, the second magnet 4122 is used as the first resisting force generation unit 412. The attractive force of the second magnet 4122 to the magnetic fluid 4112 may also be configured to make the magnetic fluid 4112 have a certain distance from the second magnetic body 421 in the first folded state. As a result, the attractive force between the magnetic fluid 4112 and the second magnetic body 421 in the first folded state is small. Moreover, the user's hands can be prevented from being gripped when the user folds the display device.

Figure 11:
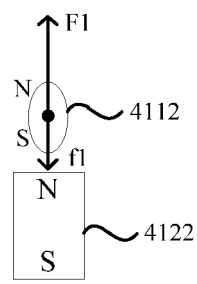
FIG. 11 is a diagram illustrating a working principle of the structure shown in FIG. 10.

Further, FIG. 11 is a diagram illustrating a working principle of the structure shown in FIG. 10. Referring to FIG. 11, since the magnetic field direction generated by the second magnet 4122 and the magnetic field direction generated by the second magnetic body 421 are the same, and the magnetic field intensity of the second magnet 4122 is smaller than the magnetic field intensity of the second magnetic body 421. Therefore, during the magnetic attraction movement, the attractive force of the second magnetic body 421 to the magnetic fluid 4112 (that is, the first attractive force) is larger than the attractive force of the second magnet 4122 to the magnetic fluid 4112 (that is, the first resisting force). In this manner, the magnetic fluid 4112 may flow towards the second magnetic body 421 under the action of the first attractive force. The reason for this disposition is that if the second magnetic body 421 and the second magnet 4122 repel each other, the magnetic fluid 4112 is originally attracted by the second magnet 4122 in the first folded state. In this case, even if the second magnetic body 421 moves towards the magnetic fluid 4112, since the second magnetic body 421 and the magnetic fluid 4112 repel each other, it is difficult to change the direction of a magnetic pole of the magnetic fluid 4112 and make the magnetic fluid 4112 move towards the second magnetic body 421. Therefore, the magnetic field direction generated by the second magnet 4122 and the magnetic field direction generated by the second magnetic body 421 are configured to be the same. Moreover, the magnetic field intensity of the second magnetic body 421 is configured to be larger. As a result, the second magnetic body 421 has a larger attractive force to the magnetic fluid 4112, and the magnetic fluid 4112 may flow towards the second magnetic body 421.

In an embodiment, the second magnet 4122 may be secured to the inside of the second housing 4132 or may be secured to the outside of the second housing 4132. The embodiments of the present disclosure are not limited thereto.

Figure 12:
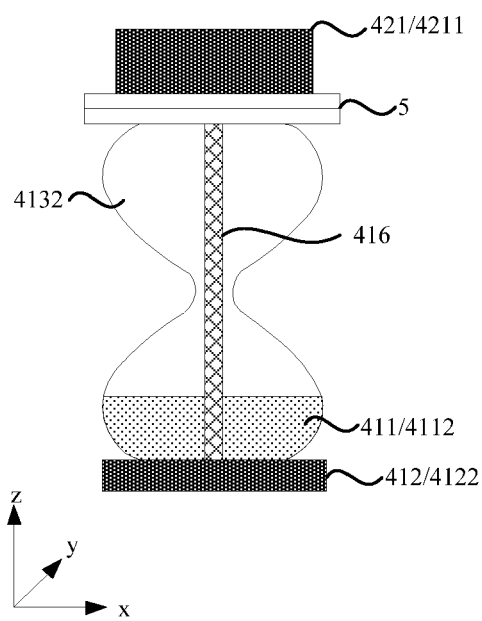
FIG. 12 is a sixth enlarged structural diagram of the Q region shown in FIG. 2.

Further, FIG. 12 is a sixth enlarged structural diagram of the Q region shown in FIG. 2. Referring to FIG. 12, in an embodiment, the section shape of the second housing 4132 along a direction perpendicular to the plane in which the first display segment 1 is located is an hourglass shape.

The inner diameter of the flow channel of the magnetic fluid may be reduced with the arrangement in which the shape of the second housing is disposed as the hourglass shape. In this manner, the flow speed of the magnetic fluid 4112 may be slowed down, and the attractive force between the magnetic fluid 4112 and the second magnetic body 421 gradually increases to avoid bringing a large acting force on the display device due to the too fast flow speed of the magnetic fluid 4112 when the second folded state is reached.

With continued reference to FIG. 12, a magnetically conductive structure 416 is also disposed in the second housing 4132, and the magnetically conductive structure 416 is configured to conduct the magnetic field generated by the second magnet 4122 and the magnetic field generated by the second magnetic body 421.

The magnetically conductive structure 416 plays a role similar to a drainage. The magnetic fluid 4112 flows along the magnetically conductive structure 416 towards the second magnetic body 421 with the arrangement in which the magnetic field generated by the second magnet 4122 and the magnetic field generated by the second magnetic body 421 are conducted. For example, the magnetically conductive structure 416 may be metal.

With continued reference to FIG. 12, in an embodiment, a clearance is provided between a portion with the smallest inner diameter in the hourglass-shaped second housing 4132 and the magnetically conductive structure 416. Therefore, the magnetic fluid 4112 may pass through the portion with the smallest inner diameter in the second housing 4132 and flow towards the second magnetic body 421.

Figure 13:
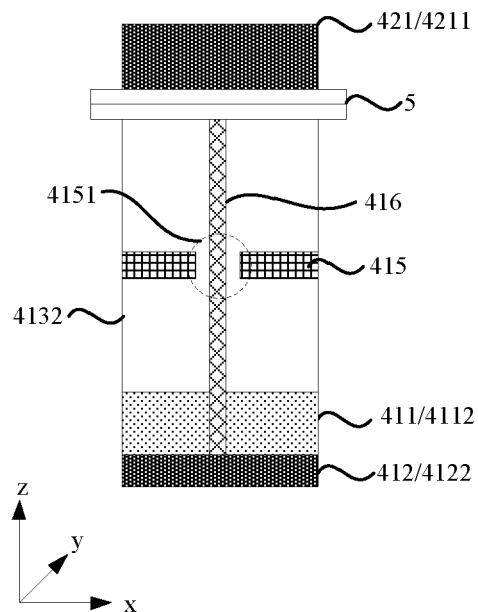
FIG. 13 is a seventh enlarged structural diagram of the Q region shown in FIG. 2.

In addition to the design of the second housing 4132 as the hourglass shape, FIG. 13 is a seventh enlarged structural diagram of the Q region shown in FIG. 2. Referring to FIG. 13, in an embodiment, at least one baffle 415 is disposed in the second housing 4132. At least one via hole 4151 is disposed on the baffle 415. A plane in which the baffle 415 is located intersects the flow direction of the magnetic fluid 4112.

In the embodiment of the present disclosure, the flow speed of the magnetic fluid 4112 may also be controlled with the arrangement in which the baffle 415 is disposed in the second housing 4132 and the via hole 4151 is disposed on the baffle 415. Moreover, the preparation process herein is simpler. It is understood that the larger an opening area of the via hole 4151 is, the faster the flow speed of the magnetic fluid 4112 is. FIG. 13 uses an example in which the baffle 415 is disposed in the second housing 4132 and the via hole 4151 is disposed on the baffle 415. In this case, in an embodiment, the magnetically conductive structure 416 passes through the via hole 4151 on the baffle 415 and a clearance is provided between the magnetically conductive structure 416 and the baffle 415. In this manner, the magnetic fluid 4112 may flow through the clearance towards the second magnetic body 421.

Further, the magnetically conductive structure 416 extends in the first direction. The first direction is perpendicular or parallel to the plane in which the first display segment 1 is located. During the magnetic attraction movement, the magnet fluid 4112 flows along the magnetically conductive structure 416 until the attractive force between the magnetic fluid 4112 and the second magnetic body 421 reaches the maximum value.

Figure 14:
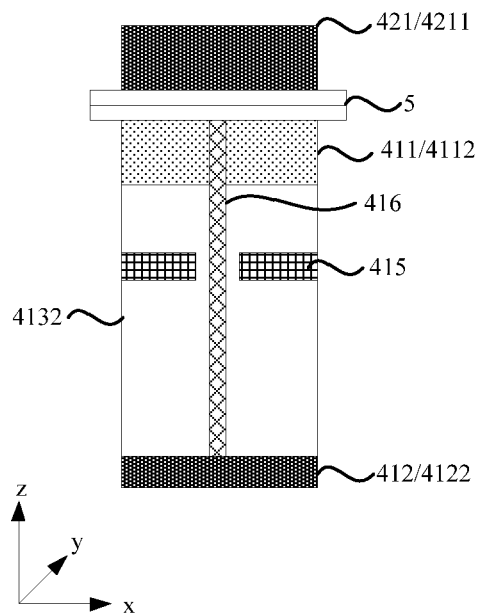
FIG. 14 is the structure shown in FIG. 13 in the second folded state.

For example, the first direction may refer to the z-direction in FIG. 13. The z-direction is perpendicular or parallel to the plane in which the first display segment 1 is located. During the magnetic attraction movement, the magnet fluid 4112 flows along the magnetically conductive structure 416 until the attractive force between the magnetic fluid 4112 and the second magnetic body 421 reaches the maximum value. For example, FIG. 14 is the structure shown in FIG. 13 in the second folded state. FIG. 14 illustrates the state when the attractive force between the magnetic fluid 4112 and the second magnetic body 421 reaches the maximum value. As shown in FIG. 14, the opposing area of the magnetic fluid 4112 and the second magnetic body 421 is the maximum, and the distance between the magnetic fluid 4112 and the second magnetic body 421 in the z-direction is the minimum. Therefore, the attractive force between the magnetic fluid 4112 and the second magnetic body 421 is the maximum, and the display device can be provided with a stable attractive force and maintain a stable folded state.

Figure 15:
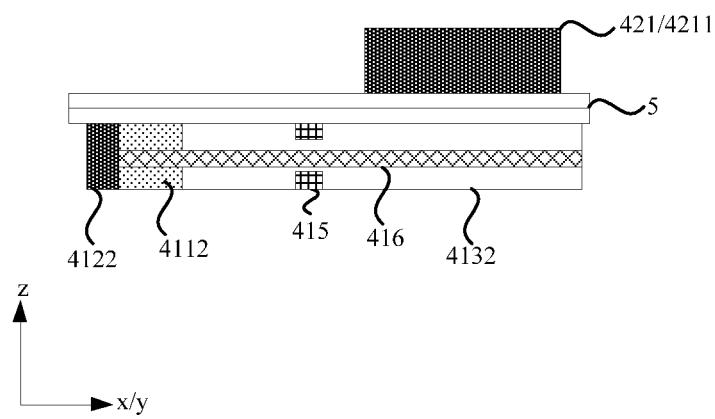
FIG. 15 is an eighth enlarged structural diagram of the Q region shown in FIG. 2.

In other embodiments, referring to FIG. 15, FIG. 15 is an eighth enlarged structural diagram of the Q region shown in FIG. 2. For example, the first direction may refer to the x-direction or the y-direction in FIG. 15. The x-direction and the y-direction are parallel to the plane in which the first display segment 1 is located. The magnetically conductive structure 416 extends in the x-direction or the y-direction. During the magnetic attraction movement, the magnet fluid 4112 flows along the magnetically conductive structure 416 until the opposing area of the magnetic fluid 4112 and the second magnetic body 421 is the maximum, and the distance between the magnetic fluid 4112 and the second magnetic body 421 in the z-direction is the minimum, that is, the state in which the attractive force between the magnetic fluid 4112 and the second magnetic body 421 reaches the maximum.

Figure 16:
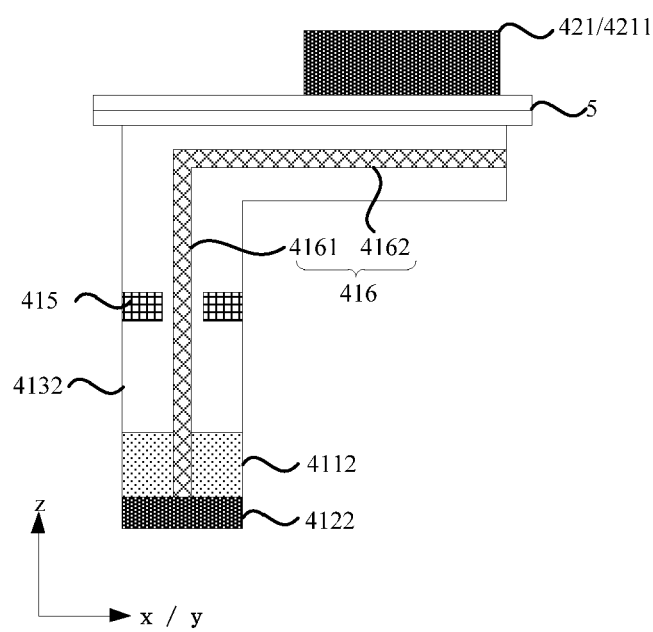
FIG. 16 is a ninth enlarged structural diagram of the Q region shown in FIG. 2.

In other embodiments, referring to FIG. 16, FIG. 16 is a ninth enlarged structural diagram of the Q region shown in FIG. 2. In an embodiment, the magnetically conductive structure 416 includes a first segment 4161 extending in the first direction and a second segment 4162 extending in the second direction. The first direction is perpendicular to the plane in which the first display segment 1 is located. The second direction is parallel to the plane in which the first display segment 1 is located. During the magnetic attraction movement, the magnet fluid 4112 flows along the magnetically conductive structure 416 until the attractive force between the magnetic fluid 4112 and the second magnetic body 421 reaches the maximum value.

As shown in FIG. 16, the first direction refers to the z-direction in FIG. 16. For example, the second direction may refer to the x-direction or the y-direction in FIG. 16, or any direction parallel to the x-y plane. With this disposition, the distance between the magnetic fluid 4112 and the second magnetic body 421 in the first folded state may be further increased, and the attractive force between the magnetic fluid 4112 and the second magnetic body 421 in the first folded state may be further decreased. In this manner, the user's hands may be prevented from being gripped when the user folds the display device. During the magnetic attraction movement, the magnet fluid 4112 flows along the magnetically conductive structure 416 until the opposing area of the magnetic fluid 4112 and the second magnetic body 421 is the maximum, and the distance between the magnetic fluid 4112 and the second magnetic body 421 in the z-direction is the minimum, that is, the state in which the attraction the magnetic fluid 4112 and the second magnetic body 421 reaches the maximum.

For the structure in which the baffle 415 is disposed in the second housing 4132, the baffle 415, in an embodiment, includes a via hole 4151. The magnetically conductive structure 416 passes through the via hole 4151 and a clearance is provided between the magnetically conductive structure 416 and the baffle 415. In another embodiment, the baffle 415 includes a plurality of via holes 4151. The magnetically conductive structure 416 passes through one of the plurality of via holes 4151 and no clearance is provided between the magnetically conductive structure 416 and the baffle 415.

Figure 17:
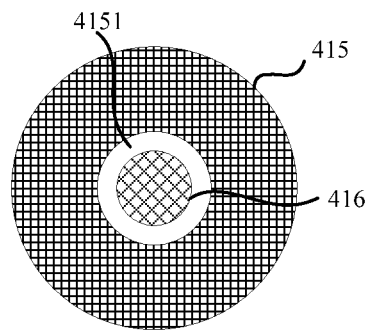
FIG. 17 is a top view of a baffle and a magnetically conductive structure in a first magnetic module.
Figure 18:
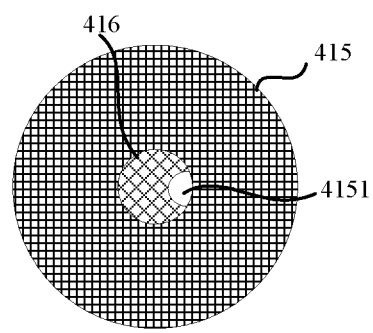
FIG. 18 is another top view of a baffle and a magnetically conductive structure in a first magnetic module.

FIG. 17 is a top view of a baffle and a magnetically conductive structure in a first magnetic module. FIG. 18 is another top view of a baffle and a magnetically conductive structure in a first magnetic module. FIGS. 17 and 18 each uses an example in which the baffle 415 includes a via hole 4151 for illustration. As shown in FIG. 17, an inner diameter of the via hole 4151 may be disposed larger than a diameter of the magnetically conductive structure 416. As a result, the clearance is provided between the magnetically conductive structure 416 and the baffle 415 to provide a flow channel for the magnetic fluid 4112. As shown in FIG. 18, the inner diameter of the via hole 4151 may be disposed equal to the diameter of the magnetically conductive structure 416, and a hole may be dug on the magnetically conductive structure 416 to provide a clearance between the magnetically conductive structure 416 and the baffle 415 to provide a flow channel for the magnetic fluid 4112.

Figure 19:
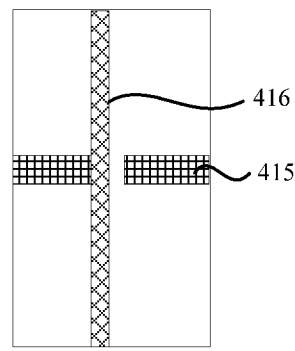
FIG. 19 is a cross-sectional view corresponding to FIG. 18.
Figure 20:
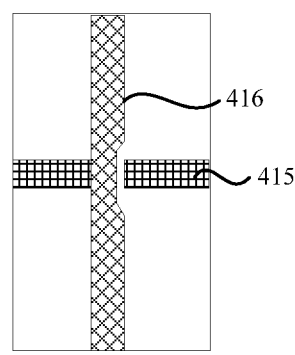
FIG. 20 is another cross-sectional view corresponding to FIG. 18.

Further, FIG. 19 is a cross-sectional view corresponding to FIG. 18. Referring to FIG. 19, for the solution of digging a hole on the magnetically conductive structure 416, a through hole may be disposed on the magnetically conductive structure 416 in the extension direction of the magnetically conductive structure 416, to provide the clearance between the magnetically conductive structure 416 and the baffle 415. FIG. 20 is another cross-sectional view corresponding to FIG. 18. Referring to FIG. 20, in other embodiments, a hole may also be dug on the magnetically conductive structure 416 at a position corresponding to a region where the baffle 415 is located, to provide a clearance between the magnetically conductive structure 416 and the baffle 415.

Figure 21:
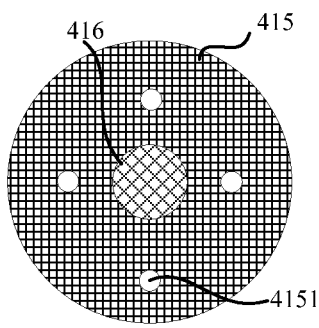
FIG. 21 is another top view of a baffle and a magnetically conductive structure in a first magnetic module.

FIG. 21 is another top view of a baffle and a magnetically conductive structure in a first magnetic module. FIG. 21 uses an example in which the baffle 415 includes a plurality of via holes 4151 for illustration. When the baffle 415 includes a plurality of via holes 4151, the magnetically conductive structure 416 may pass through one of the plurality of via holes 4151 and no clearance is provided between the magnetically conductive structure 416 and the baffle 415. In this manner, the baffle 415 may be configured to strengthen the security of the magnetically conductive structure 416, and other via holes 4151 in the baffle 415 may provide flow channels for the magnetic fluid 4112.

It is to be noted that FIGS. 17, 18, and 21 merely use a circular baffle 415 as an example for illustration. In other embodiments, the baffle 415 may also be any polygon and may be designed according to a shape of the second housing 4132. The embodiments of the present disclosure are not limited thereto.

the second structure of the first magnetic module 41 is described in detail in the preceding embodiment. The preceding embodiments may be combined with each other in a case of no contradiction, and the embodiments of the present disclosure are not limited thereto.

In the preceding embodiments, the structure of the first magnetic module 41 and the structure of the second magnetic module 42 are described below in detail by using an example in which at least a portion of the first magnetic module 41 may move towards the second magnetic module 42 during the magnetic attraction movement. In other embodiments, at least a portion of the first magnetic module 41 may move towards the second magnetic module 42, and at the same time, at least a portion of the second magnetic module 42 may move towards the first magnetic module 41. Therefore, the distance between the magnetic element of the first magnetic module 41 and the magnetic element of the second magnetic module 42 in the first folded state may be further increased, and the attractive force between the first magnetic module 41 and the second magnetic module 42 in the first folded state may be decreased. Therefore, the effect of the embodiments of the present disclosure in preventing the user's hands from being gripped is further improved.

Figure 22:
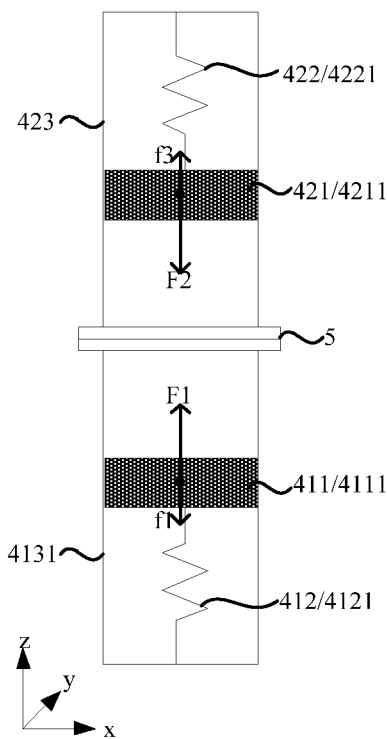
FIG. 22 is a tenth enlarged structural diagram of the Q region shown in FIG. 2.
Figure 23:
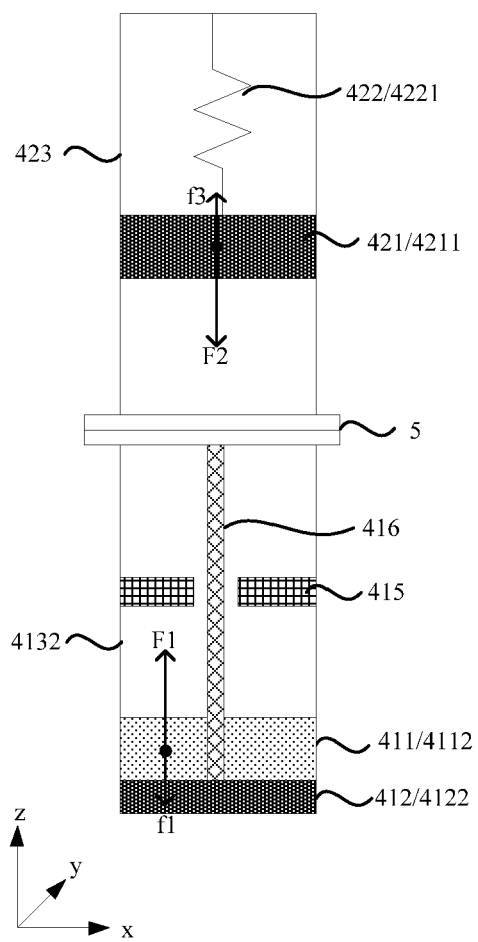
FIG. 23 is an eleventh enlarged structural diagram of the Q region shown in FIG. 2.

For example, FIG. 22 is a tenth enlarged structural diagram of the Q region shown in FIG. 2. FIG. 23 is an eleventh enlarged structural diagram of the Q region shown in FIG. 2. Referring to FIG. 22 or FIG. 23, the second magnetic module 42 includes a third resisting force generation unit 422 in addition to the second magnetic body 421. During the magnetic attraction movement, the third resisting force generation unit 422 is configured to provide the second magnetic body 421 with a third resisting force f3 opposite to the direction of the second attractive force F2. The second attractive force F2 is larger than the third resisting force f3.

During the magnetic attraction movement, the first magnetic body 411 may move towards the second magnetic body 421 under the action of the first attractive force F1, and at the same time, the second magnetic body 421 may move towards the first magnetic body 411 under the action of the second attractive force F2. The action of the third resisting force generation unit 422 is substantially consistent with the action of the first resisting force generation unit 412, that is, the movement of the second magnetic body 421 during the magnetic attraction movement may be slowed down. Therefore, the attractive force between the first magnetic body 411 and the second magnetic body 421 gradually increases to avoid bringing a large acting force on the display device due to the too fast movement between the second magnetic body 421 and the first magnetic body 411 when the second folded state is reached.

For example, FIG. 22 uses an example in which the first magnetic body 411 of the first magnetic module 41 is the first magnet 4111, and the first resisting force generation unit 412 is the first spring 4121 for illustration. FIG. 23 uses an example in which the first magnetic body 411 of the first magnetic module 41 is the magnetic fluid 4112, and the first resisting force generation unit 412 is the second magnet 4122 for illustration.

Further, referring to FIG. 22 or FIG. 23, in an embodiment, the third resisting force generation unit 422 includes a second spring 4221. The second magnetic module 42 further includes a third housing 423. The second magnetic body 421 and the second spring 4221 are both located in the third housing 423. A first end of the second spring 4221 is secured to the third housing 423. A second end of the second spring 4221 is secured to the second magnetic body 421. In the first folded state, the second spring 4221 is located on a side of the second magnetic body 421 facing away from the first magnetic body 411. During the magnetic attraction movement, the second magnetic body 421 moves towards the first magnetic body 411 under the action of the second attractive force, and the second spring 4221 is stretched and provides the third resisting force.

With the arrangement in which the second spring 4221 is selected as the second resisting force generation unit 414, not only the third resisting force may be provided to the second magnetic body 421 by the second spring 4221 during the magnetic attraction movement, but also the second magnetic body 421 may be returned to the original position (for example, the position in the first folded state) by the restoring force of the second spring 4221 when the user opens the display device from the folded state to the unfolded state. In addition, the second spring 4221 may select a non-linear spring, and may have elasticity in any direction in a three-dimensional direction. The non-Newtonian fluid may also be disposed in the third housing 423 to increase the resisting force to the second magnetic body 421. The design therefor may be made with reference to the preceding relevant embodiments in which the first magnetic body 411 is the first magnet 4111, and the first resisting force generation unit 412 is the first spring 4121. The details thereof would not be repeated herein.

Finally, it is to be noted that the embodiments of the present disclosure do not limit a type of the display device, including but not limited to foldable electronic products such as mobile phones, laptops, tablet computers, digital cameras, medical equipment, industrial control equipment, and touch interactive terminals. The solutions provided by the embodiments of the present disclosure can prevent the user's hands from being gripped when the user folds the display device and can ensure that the display device can maintain a stable folded state.

It is to be noted that the above are merely preferred embodiments of the present disclosure and technical principles used therein. It is to be understood by those skilled in the art that the present disclosure is not limited to the specific embodiments described herein. Those skilled in the art may make various apparent modifications, adaptations, and substitutions without departing from the scope of the present disclosure. Therefore, while the present disclosure has been described in detail through the preceding embodiment, the present disclosure is not limited to the preceding embodiment and may include more other equivalent embodiments without departing from the concept of the present disclosure. The scope of the present disclosure is determined by the scope of the appended claims.

What is claimed is:

1. A display device, comprising a first display segment and a second display segment connected to each other and foldable towards each other, wherein the display device further comprises at least one magnetic component;
    the magnetic component comprises a first magnetic module located in a non-display region of the first display segment and a second magnetic module located in a non-display region of the second display segment;
    the display device comprises a first folded state and a second folded state, two opposite ends each of which respectively belongs to the first display segment and the second display segment and faces away from a folding axis are contact ends, the first folded state is a state in which the contact ends come into contact with each other, and the second folded state is a state in which the contact ends have been in contact for a period of time; and
    in the first folded state, an attractive force of the first magnetic module to the second magnetic module is A; and in the second folded state, the attractive force of the first magnetic module to the second magnetic module is B, and A<B;
    wherein the display device performs a magnetic attraction movement from the first folded state to the second folded state, the first magnetic module comprises a first magnetic body and a first resisting force generation unit the second magnetic module comprises at least a second magnetic body; during the magnetic attraction movement, the second magnetic body provides a first attractive force to the first magnetic body, the first magnetic body provides a second attractive force to the second magnetic body, and the first resisting force generation unit is configured to provide the first magnetic body with a first resisting force opposite to a direction of the first attractive force; and
    the first attractive force is larger than the first resisting force.

2. The display device of claim 1, wherein
    during the magnetic attraction movement, the attractive force of the first magnetic module to the second magnetic module increases progressively.

3. The display device of claim 1, wherein at least a portion of the first magnetic module is movable towards the second magnetic module during the magnetic attraction movement.

4. The display device of claim 1, wherein the first magnetic body comprises a first magnet, and the first resisting force generation unit comprises a first spring;
    the first magnetic module further comprises a first housing; the first magnet and the first spring are both located in the first housing; a first end of the first spring is secured to the first housing, and a second end of the first spring is secured to the first magnet; and in the first folded state, the first spring is located on a side of the first magnet facing away from the second magnetic body; and
    during the magnetic attraction movement, the first magnet moves towards the second magnetic body under an action of the first attractive force, and the first spring is stretched and provides the first resisting force.

5. The display device of claim 4, wherein the first spring has elasticity in a first direction, and the first direction is perpendicular or parallel to a plane in which the first display segment is located; and
    during the magnetic attraction movement, the first magnet moves in the first direction until an attractive force between the first magnet and the second magnetic body reaches a maximum value.

6. The display device of claim 4, wherein the first spring is a non-linear spring.

7. The display device of claim 4, wherein a second resisting force generation unit is disposed in the first housing;
    during the magnetic attraction movement, the second resisting force generation unit is configured to provide the first magnet with a second resisting force opposite to the direction of the first attractive force; and
    a sum of the first resisting force and the second resisting force is smaller than the first attractive force.

8. The display device of claim 7, wherein the second resisting force generation unit comprises a non-Newtonian fluid, and fluidity of the non-Newtonian fluid decreases as an impact force of the first magnet on the non-Newtonian fluid increases.

9. The display device of claim 1, wherein the first magnetic body comprises a magnetic fluid, and the first resisting force generation unit comprises a second magnet;
    the first magnetic module further comprises a second housing, at least the magnetic fluid is located in the second housing, and the second magnet is secured to the second housing;
    in the first folded state, the second magnet is located on a side of the magnetic fluid facing away from the second magnetic body, a magnetic field direction generated by the second magnet and a magnetic field direction generated by the second magnetic body are the same, and a magnetic field intensity of the second magnet is smaller than a magnetic field intensity of the second magnetic body; and during the magnetic attraction movement, the magnetic fluid flows towards the second magnetic body under an action of the first attractive force.

10. The display device of claim 9, wherein at least one baffle is disposed in the second housing, at least one via hole is disposed in the baffle, and a plane in which the baffle is located intersects a flow direction of the magnetic fluid, or a section shape of the second housing along a direction perpendicular to a plane in which the first display segment is located is an hourglass shape.

11. The display device of claim 10, wherein a magnetically conductive structure is disposed in the second housing, and the magnetically conductive structure is configured to conduct a magnetic field generated by the second magnet and a magnetic field generated by the second magnetic body.

12. The display device of claim 11, wherein the baffle comprises a via hole, and the magnetically conductive structure passes through the via hole and a clearance is provided between the magnetically conductive structure and the baffle,
the baffle comprises a plurality of via holes, and the magnetically conductive structure passes through one of the plurality of via holes and no clearance is provided between the magnetically conductive structure and the baffle, or
wherein a clearance is provided between a portion with a smallest inner diameter in the hourglass-shaped second housing and the magnetically conductive structure.

13. The display device of claim 11, wherein the magnetically conductive structure extends in a first direction, and the first direction is perpendicular or parallel to the plane in which the first display segment is located; and
during the magnetic attraction movement, the magnet fluid flows along the magnetically conductive structure until an attractive force between the magnetic fluid and the second magnetic body reaches a maximum value.

14. The display device of claim 11, wherein the magnetically conductive structure comprises a first segment extending in a first direction and a second segment extending in a second direction, the first direction is perpendicular to the plane in which the first display segment is located, and the second direction is parallel to the plane in which the first display segment is located, and during the magnetic attraction movement, the magnet fluid flows along the magnetically conductive structure until an attractive force between the magnetic fluid and the second magnetic body reaches a maximum value.

15. The display device of claim 1, wherein the display device further comprises a cover plate located on a display side of the second display segment, and the second magnetic body is secured to a non-display side of the cover plate.

16. The display device of claim 1, wherein the second magnetic module further comprises a third resisting force generation unit;
during the magnetic attraction movement, the third resisting force generation unit is configured to provide the second magnetic body with a third resisting force opposite to a direction of the second attractive force; and
the second attractive force is larger than the third resisting force.

17. The display device of claim 16, wherein the third resisting force generation unit comprises a second spring;
the second magnetic module further comprises a third housing, the second magnetic body and the second spring are both located in the third housing, a first end of the second spring is secured to the third housing, a second end of the second spring is secured to the second magnetic body, and in the first folded state, the second spring is located on a side of the second magnetic body facing away from the first magnetic body; and
during the magnetic attraction movement, the second magnetic body moves towards the first magnetic body under an action of the second attractive force, and the second spring is stretched and provides the third resisting force.

18. The display device of claim 1, wherein the second magnetic body comprises a third magnet.

19. The display device of claim 1, wherein the display device further comprises a flexible display panel, and in an unfolded state, the first magnetic module and the second magnetic module are respectively located on two opposite sides of the flexible display panel facing away from the folding axis.

* * * * *